United States Patent
Fish et al.

(10) Patent No.: US 10,032,601 B2
(45) Date of Patent: Jul. 24, 2018

(54) PLATEN SUPPORT STRUCTURE

(71) Applicant: Varian Semiconductor Equipment Associates, Inc., Gloucester, MA (US)

(72) Inventors: Roger B. Fish, Bedford, MA (US); Steven Anella, West Newbury, MA (US); Todd Lewis MacEachern, Raymond, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 670 days.

(21) Appl. No.: 14/186,678

(22) Filed: Feb. 21, 2014

(65) Prior Publication Data
US 2015/0243470 A1    Aug. 27, 2015

(51) Int. Cl.
*H01J 37/20* (2006.01)
*H01J 37/317* (2006.01)
*H01L 21/683* (2006.01)

(52) U.S. Cl.
CPC .......... *H01J 37/20* (2013.01); *H01J 37/3171* (2013.01); *H01L 21/6833* (2013.01); *H01J 2237/20* (2013.01); *H01J 2237/2001* (2013.01); *H01J 2237/31701* (2013.01)

(58) Field of Classification Search
CPC ....... B25B 11/005; B25B 5/145; B25B 13/44; H01L 21/6833; H01J 37/20
USPC .......................................... 269/21, 20, 289 R
See application file for complete search history.

(56) References Cited

U.S. PATENT DOCUMENTS

| 2,877,538 | A | * | 3/1959 | Coulon | B23Q 1/38 269/20 |
| 5,545,283 | A | * | 8/1996 | Collins | H01L 21/67144 156/285 |
| 5,822,172 | A | * | 10/1998 | White | H01L 21/67103 361/234 |
| 5,824,246 | A | * | 10/1998 | Reetz | B27N 3/086 264/122 |

(Continued)

FOREIGN PATENT DOCUMENTS

| WO | 1996011495 A1 | 4/1996 |
| WO | 2000019492 A2 | 4/2000 |
| WO | 2012118606 A2 | 9/2012 |

OTHER PUBLICATIONS

International Search Report and Written Opinion dated May 20, 2015, in corresponding international patent application No. PCT/US2015/016132.

*Primary Examiner* — Christopher M Koehler
*Assistant Examiner* — Seahee Yoon

(57) ABSTRACT

A platen support structure adapted to thermally insulate a heated platen portion from a cold base plate while providing substantially leak-free gas transport therebetween and while allowing thermal expansion and contraction of the platen portion. Various examples provide of the support structure provide a tubular flexure having an internal gas conduit, a platen portion mounting tab connected to the flexure and having an internal gas input slot that is in fluid communication with the internal gas conduit of the flexure, the platen portion mounting tab being adapted for connection to a platen portion of a platen, and a base plate mounting tab connected to the flexure and having an internal gas output slot that is in fluid communication with the internal gas conduit of the flexure, the base plate mounting tab being adapted for connection to a base plate of the platen.

14 Claims, 8 Drawing Sheets

(56) References Cited

U.S. PATENT DOCUMENTS

| | | | | |
|---|---|---|---|---|
| 6,113,702 A | * | 9/2000 | Halpin | H01L 21/68792 118/500 |
| 6,203,622 B1 | * | 3/2001 | Halpin | H01L 21/68735 118/500 |
| 2002/0113340 A1 | * | 8/2002 | Reetz | B27N 3/00 264/320 |
| 2002/0172764 A1 | | 11/2002 | Caldwell et al. | |
| 2006/0113719 A1 | * | 6/2006 | Nagai | H01L 21/6838 269/20 |
| 2010/0194015 A1 | * | 8/2010 | Vekstein | H01L 21/6875 269/289 R |
| 2012/0074126 A1 | * | 3/2012 | Bang | H01L 21/68785 219/443.1 |
| 2012/0305190 A1 | * | 12/2012 | Kang | H01J 37/321 156/345.34 |
| 2014/0174655 A1 | * | 6/2014 | Grinberg | B24B 37/048 156/345.13 |

\* cited by examiner

PLATEN SUPPORT STRUCTURE

FIELD OF THE DISCLOSURE

Embodiments of the present disclosure generally relate to the field of substrate processing, and more particularly to a flexible platen support structure with an integrated gas conduit.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is important for proper IC performance. To achieve a desired doping profile, one or more ion species may be implanted in different doses and at different energies.

In some ion implantation processes, a desired doping profile is achieved by implanting ions in a target substrate at high temperatures (e.g., between 150-600° Celsius). Heating the target substrate can be achieved by supporting the substrate on a heated platen during the ion implantation process. A typical heated platen includes a heated platen portion for supporting and heating a substrate, and a cold base plate that is coupled to a backside of the platen portion and that is adapted to be connected to a scanning mechanism. The platen portion and the base plate are often provided with interconnected internal fluid conduits configured to convey a gas (commonly referred to as a "backside gas") from a gas source to gaps formed between the platen portion and a substrate. Providing gas in these gaps can enhance thermal contact between the platen and the substrate, which is important if the substrate is to be heated during processing operations.

Such heated platen configurations are associated with a number of challenges. For example, the platen portion and the base plate must be coupled to one another in a manner that provides sufficient mechanical strength to withstand acceleration forces during movement of the platen by the scanning mechanism. Additionally, the hot platen portion should be thermally insulated from the cold base plate in order to minimize heat flow therebetween that could otherwise produce cold spots in the platen portion. Furthermore, since dielectric materials (e.g., ceramics) are generally brittle and are prone to fracture under stress, the platen portion must be coupled to the base plate in a manner that presents minimal resistance to expansion and contraction of the platen portion when it is heated and cooled. Still further, since the presence of gas or other foreign matter in the high vacuum environment of the platen may be detrimental to ion implantation processes, the platen portion and the base plate must be coupled to one another in a manner that provides substantially leak-free transport of gas therebetween.

In view of the foregoing, it will be understood that there is a need to provide a platen support structure that provides strong mechanical coupling, good thermal insulation, and leak-free gas transport between a heated platen portion and a cold base plate while facilitating thermal expansion and contraction of the platen portion without causing damage thereto.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In general, various embodiments of the present disclosure provide a platen support structure that is adapted to thermally insulate a heated platen portion from a cold base plate while providing substantially leak-free gas transport therebetween and while allowing thermal expansion and contraction of the dielectric layer. An exemplary embodiment of a support structure in accordance with the present disclosure includes a tubular flexure having an internal gas conduit, a platen portion mounting tab connected to the flexure and having an internal gas input slot in fluid communication with the internal gas conduit, the platen portion mounting tab adapted for connection to a platen portion of a platen, and a base plate mounting tab connected to the flexure and having an internal gas output slot in fluid communication with the internal gas conduit, the base plate mounting tab being adapted for connection to a base plate of the platen.

An embodiment of a platen in accordance with the present disclosure may include a platen portion having a gas port for providing a gas to an interface region on a surface of the platen portion, a base plate, a tubular flexure disposed intermediate the platen portion and the base plate, the flexure having an internal gas conduit, a platen portion mounting tab connected to the flexure and having an internal gas input slot in fluid communication with the internal gas conduit, the platen portion mounting tab coupled to the platen portion, and a base plate mounting tab connected to the flexure and having an internal gas output slot in fluid communication with the internal gas conduit, the base plate mounting tab coupled to the base plate.

Another embodiment of a platen in accordance with the present disclosure may include a platen portion having a gas port for providing a gas to an interface region on a surface of the platen portion, a base plate, a tubular flexure disposed intermediate the platen portion and the base plate, the flexure having an internal gas conduit, a platen portion mounting tab connected to the flexure and having an internal gas input slot in fluid communication with the internal gas conduit, the platen portion mounting tab further having a mounting hole formed therethrough, wherein the internal gas input slot opens to the mounting hole, a base plate mounting tab connected to the flexure and having an internal gas output slot in fluid communication with the internal gas conduit, the base plate mounting tab further having a mounting hole formed therethrough, wherein the internal gas output slot opens to the mounting hole, the base plate mounting tab coupled to the base plate, and a gas feed fixture comprising a gas feed tube extending through the mounting hole in the platen portion mounting tab and into the gas port, wherein an interior of the gas feed tube is in fluid communication with the internal gas outlet slot.

BRIEF DESCRIPTION OF THE DRAWINGS

By way of example, various embodiments of the disclosed device will now be described, with reference to the accompanying drawings, in which.

DETAILED DESCRIPTION

Embodiments of the present disclosure provide a platen support structure for mechanically coupling a platen portion to a base plate of a heated platen. During operation, the platen support structure described herein may be adapted to thermally insulate the heated platen portion from the cold base plate while providing substantially leak-free gas transport therebetween and while allowing thermal expansion and contraction of the dielectric layer. As will be appreciated, the platen support structure described herein may be implemented in a heated platen which may be used to support a substrate during processing thereof. For example, the heated platen may be used to support a substrate during an ion implantation process, a plasma deposition process, an etching process, a chemical mechanical planarization process, or generally any process where a semiconductor substrate is to be supported on a heated platen. As such, an exemplary heated platen is described. It will be appreciated, however, that the embodiments of the present disclosure are not limited by the exemplary heated platen described herein and may find application in any of a variety of other platen applications used in a variety of semiconductor manufacturing processes.

Figure 1:
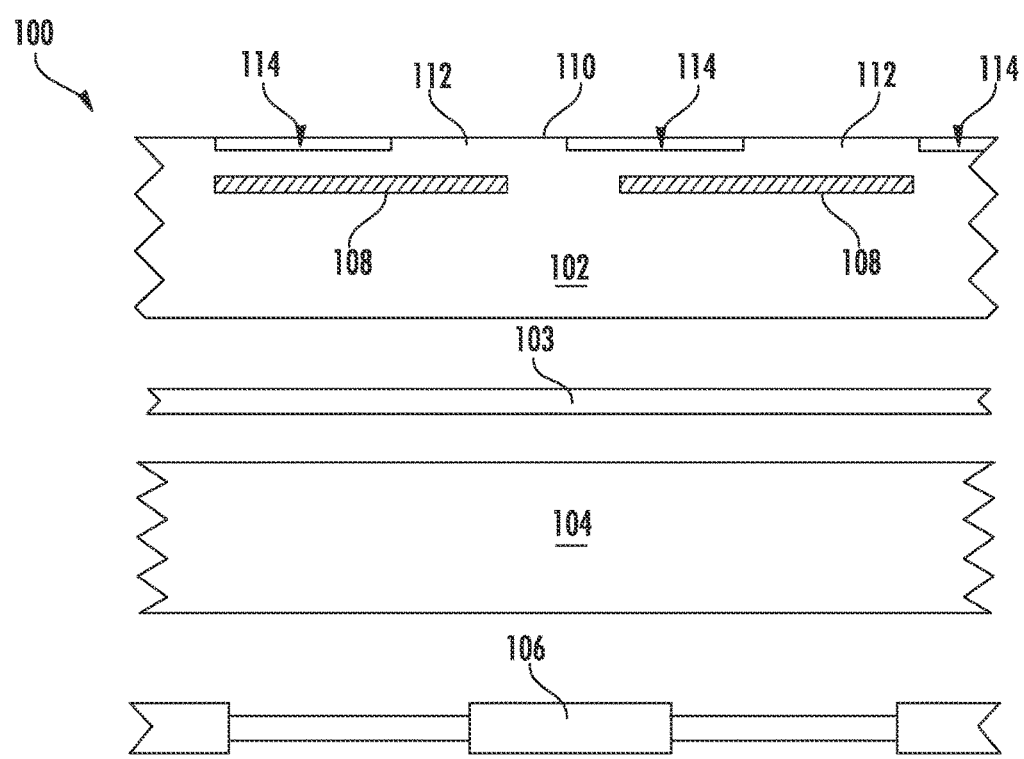
FIG. 1 is a partial cross-section view of a first exemplary heated platen in accordance with an embodiment of the present disclosure.

FIG. 1 illustrates a block diagram showing an exploded partial cut-away view of an exemplary heated platen 100 in accordance with an embodiment of the present disclosure. The platen 100 may include a platen portion 102, a radiation shield 103, a base plate 104, and a platen support structure 106 (hereinafter "the support structure 106"), all of which may be coupled together in a vertically stacked relationship as further described below. The base plate 104 may be mounted to, or may form part of, a scanning mechanism (not shown) that may facilitate various angular and/or rotational movements of the platen 100.

The platen portion 102 may have electrodes 108 embedded therein for generating an electrostatic force that may hold a substrate (not shown) onto a support surface 110 of the platen portion 102. The support surface 110 of the platen portion 102 may be smooth, or it may be provided with mesa structures 112 for reducing backside contact with a substrate, which can reduce the generation of backside particles. The support surface 110 may additionally be provided with a plurality of cavities or interface regions 114 that may create gaps between the support surface 110 and a substrate mounted thereon. These interface regions 114 may be supplied with a gas for improving or adjusting thermal contact between the platen portion 102 and a substrate. Such gas may be delivered to the interface regions 114 via internal ports and conduits (not shown in FIG. 1) that extend through the platen portion 102, the base plate 104, and the support structure 106 as further described below.

Figure 2:
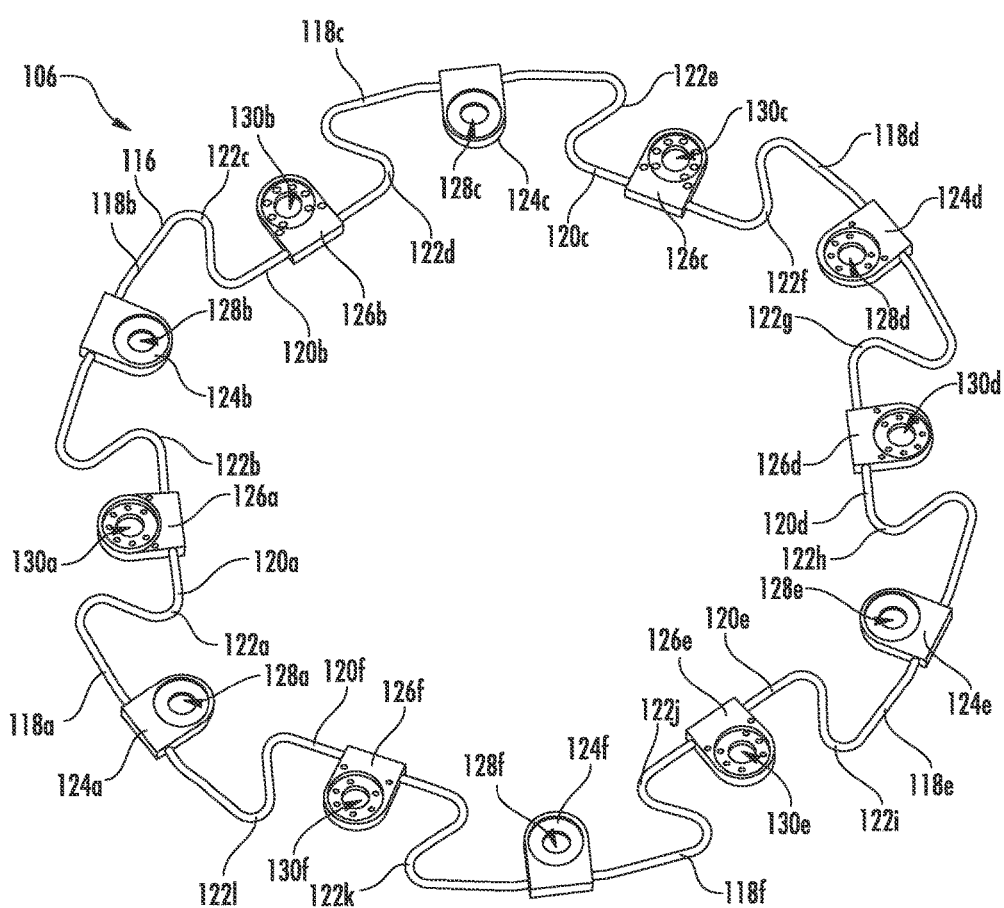
FIG. 2 is an isometric view of a platen support structure portion of the heated platen of FIG. 1.

Referring to FIG. 2, the support structure 106 may include a generally circular flexure 116 formed of tubing. The flexure 116 is shown as being formed of round tubing, but this is not critical. The tubing may alternatively have any of a variety of cross-sectional shapes, including, but not limited to, rectangular, elliptical, triangular, irregular, etc. The flexure 116 may be defined by a plurality of alternating radially-outermost segments 118a-f (hereinafter "the outer segments 118a-f") and radially-innermost segments 120a-f (hereinafter "the inner segments 120a-f") that may be joined together by a plurality of radially intermediate, serpentine (e.g., S-shaped) connecting segments 122a-l. The flexure 116 may be formed of a strong, thermally resistant material, such as a nickel-chromium-based alloy (e.g., ICONEL) tubing.

The support structure 106 may further include a plurality of base plate mounting tabs 124a-f that may each be connected to a respective one of the outer segments 118a-f and a plurality of platen portion mounting tabs 126a-f that may each be connected to a respective one of the inner segments 120a-f. The mounting tabs 124a-f, 126a-f may have respective mounting holes 128a-f, 130a-f formed therethrough for receiving mechanical fasteners as further described below. The base plate mounting tabs 124a-f are shown as extending radially inwardly from the inner segments 118a-f, and the platen portion mounting tabs 126a-f are shown as extending radially outwardly from the outer segments 120a-f, but this particular configuration is not critical. For example, it is contemplated that some or all of the base plate mounting tabs 124a-f may alternatively extend radially outwardly from the outer segments 118a-f, and that some or all of the platen portion mounting tabs 126a-f may alternatively extend radially inwardly from the inner segments 120a-f. The mounting tabs 124a-f, 1256a-f may be formed of a corrosion resistant metal, such as stainless steel.

The tubular flexure 116 may define an internal gas conduit 132 (see FIG. 5) that extends substantially throughout the flexure 116. Each of the platen portion mounting tabs 126 may define an internal gas outlet 134 (see FIG. 5) that may be in fluid communication with the gas conduit 132. Similarly, one or more of the base plate mounting tabs 124a-f, such as the base plate mounting tab 124d, may define an internal gas inlet (not shown) that may be in fluid communication with the gas conduit 132. Thus arranged, gas can flow through the platen portion mounting tabs 126, base plate mounting tabs 124 and gas conduit 132.

Figure 3:
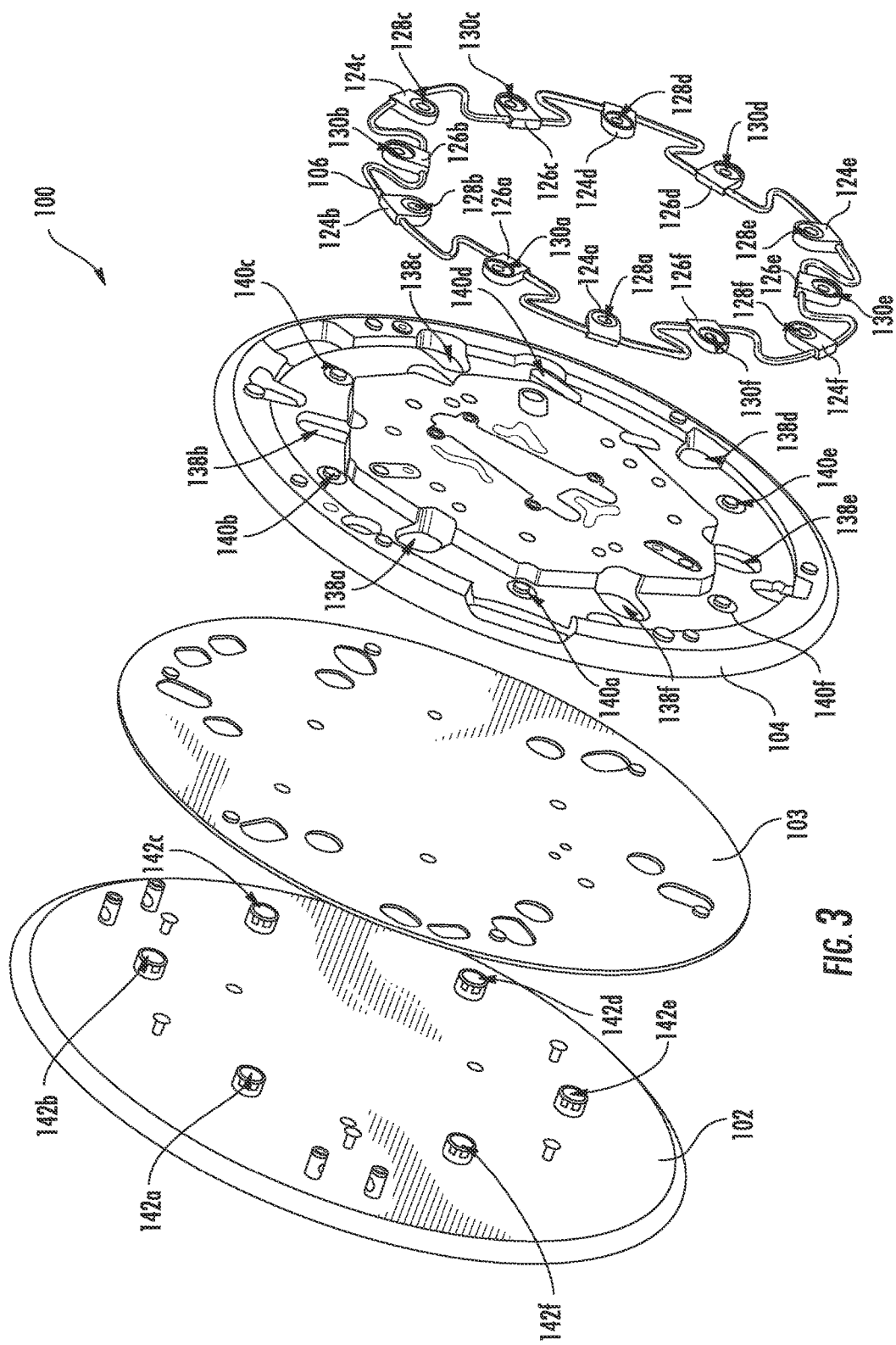
FIG. 3 is an exploded bottom isometric view of the heated platen of FIG. 1.

Referring to FIG. 3, the base plate 104 may include a plurality of apertures 138a-f, each of which may be adapted to receive a respective one of the platen portion mounting tabs 126a-f therein. The base plate 104 may additionally be provided with a plurality of mounting holes 140a-f, each of which may be aligned with a respective one of the mounting holes 128a-f in the base plate mounting tabs 124a-f. The platen portion 102 may similarly be provided with a plurality of mounting holes 142a-f, each of which may be aligned with a respective one of the mounting holes 130a-f in the platen portion mounting tabs 126a-f.

Figure 4:
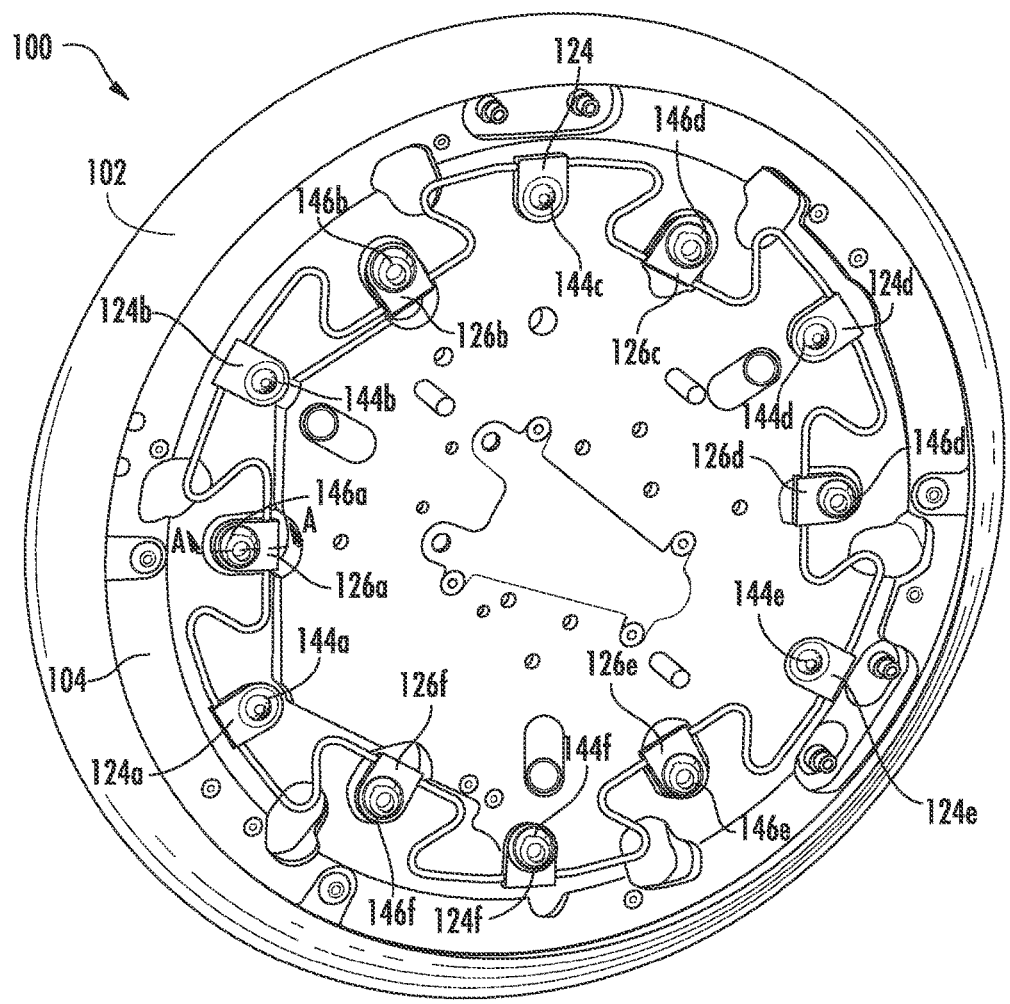
FIG. 4 is a bottom isometric view of the heated platen of FIG. 1.

Referring to FIG. 4, the base plate mounting tabs 124a-f may be fastened to the backside of the base plate 104 by respective mechanical fasteners 144a-f (e.g., threaded fasteners such as socket head cap screws) that extend through the mounting holes 128a-f and securely engage the mounting holes 140a-f (shown in FIG. 3) in the base plate 104. The base plate mounting tab 124d, which defines an internal gas chamber that is in fluid communication with the gas conduit 132 of the flexure 116 as described above, may be coupled to a gas supply line (not shown) that may extend from a scanning mechanism (not shown) to which the base plate 104 may be coupled.

Figure 5:
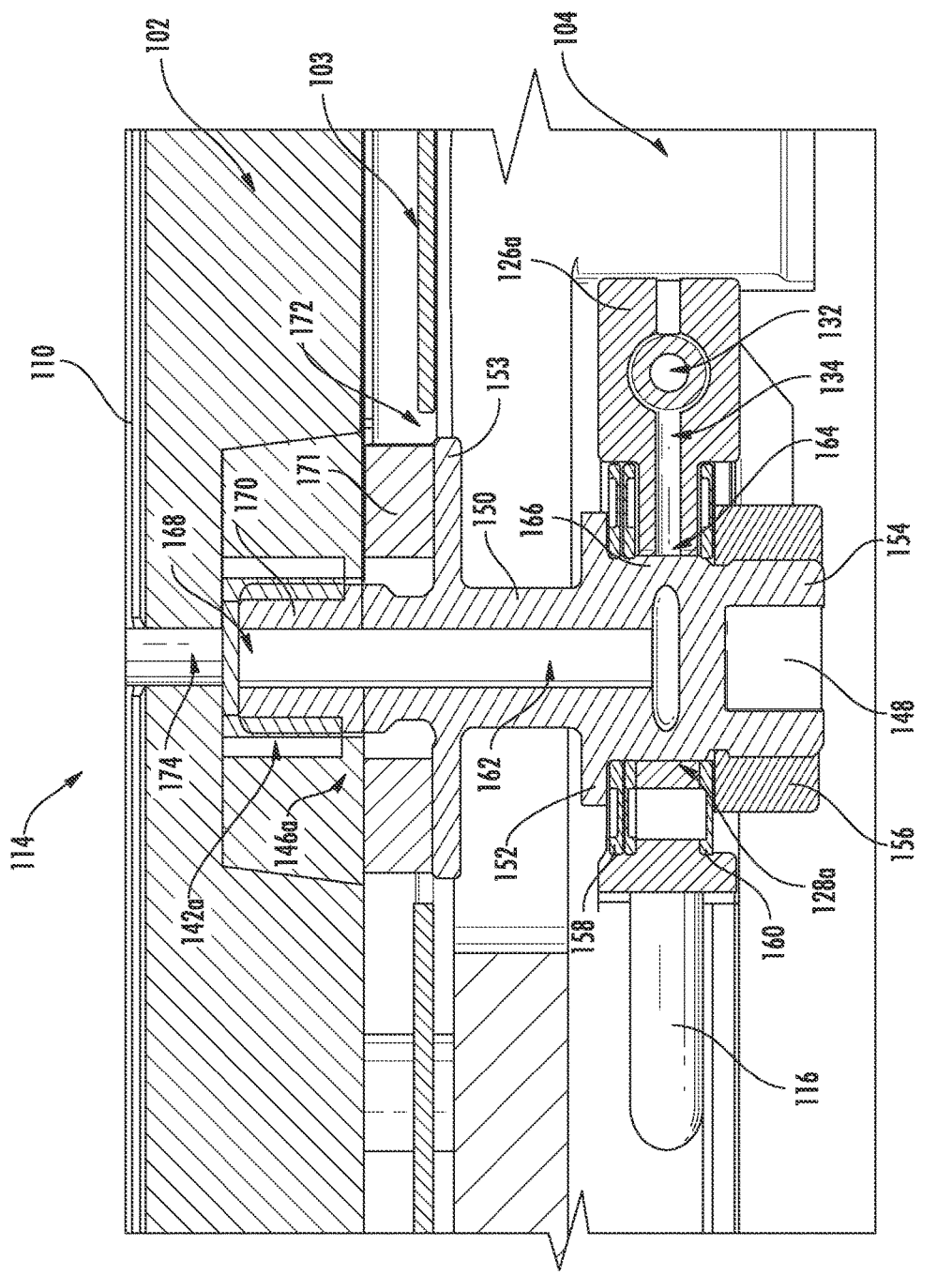
FIG. 5 is a cross-section view of a gas feed fixture portion of the support structure of the present disclosure taken along the plane A-A in FIG. 4.

The platen portion mounting tabs 126a-f may be coupled to the platen portion 102 by respective gas feed fixtures 146a-f. Referring to FIG. 5, a partial cross-section view illustrating one of the gas feed fixtures 146a is shown. The gas feed fixture 146a may be substantially identical to the gas feed fixtures 146b-f shown in FIG. 4. It will therefore be understood that the following description of the gas feed fixture 146a may also apply to each of the other gas feed fixtures 146b-f.

The gas feed fixture 146a may include a gas feed tube 148 that may be formed of a material having a thermal expansion rate that is similar to that of the platen portion 102. One non-limiting example of such a material is a nickel-cobalt ferrous alloy (e.g., KOVAR). Alternatively, it is contemplated that the gas feed tube 148 may be formed of various ceramics which may facilitate better thermal isolation of the platen portion 102 relative to metals. The gas feed tube 148 may extend through the mounting aperture 128a of the platen portion mounting tab 126a. An upper portion 150 of the gas feed tube 148 may extend above the platen portion mounting tab 126a and may be provided with first and second annular flanges 152, 153 that extend radially-outwardly the upper portion 150. A threaded lower portion 154 of the gas feed tube 148 may extend past the platen portion mounting tab 126a and may engage a threaded nut 156 for locking the platen portion mounting tab 126a to the gas feed tube. Upper and lower annular seals 158, 160, which may be formed of a thermally-resistant material (e.g., stainless steel) may be disposed between the first annular flange 152 and the top of the platen portion mounting tab 126a and between the locking nut 156 and the bottom of the platen portion mounting tab 126a, respectively, for providing a substantially fluid-tight connection between the platen portion mounting tab 126a and the gas feed tube 148. An interior of the gas feed tube 148 may define a gas pass-through conduit 162 that extends from an inlet port 164 in a sidewall 166 of the gas feed tube 148 to an outlet port 168 in an upper end 170 of the gas feed tube 148.

Still referring to FIG. 5, the upper end 170 of the gas feed tube 148 may extend above the top surface of the base plate 104 and through an aperture 172 in the radiation shield 103. An O-ring 171, which may be formed of a thermally-resistant material (e.g., stainless steel), may be disposed atop the second annular flange 153 and may flatly engage the backside of the platen portion 102, thereby supporting the platen portion 102 at a distance above the base plate 104 and providing a fluid-tight seal between the gas feed tube 148 and the platen portion. The upper end 170 of the gas feed tube 148 may extend into the mounting hole 142a in the platen portion 102. The gas pass-through conduit 162 in the gas feed tube 148 may thereby provide a fluid passageway that extends between the gas outlet slot 134 in the platen portion mounting tab 126a and a gas port 174 that extends from the mounting hole 142a in the backside of the platen portion 102 to the interface region 114 on the support surface 110 of the platen portion.

During operation of the platen 100, the platen portion 102 may be heated by supplying electrical current to a metallization layer (not shown) embedded within, or disposed on a backside of, the platen portion. As the platen portion 102 is heated, a low pressure gas may be supplied to the gas inlet slot within the base plate mounting tab 124d (as described above). The gas may flow through the internal gas conduit 132 (shown in FIG. 5) within the flexure 116 and into the gas outlet slots 134 within the platen portion mounting tabs 126a-f. The gas may then flow through the gas feed tubes 148 and through the gas ports 174 to the interface regions 114 on the support surface 110 of the platen portion 102, where the gas may enhance thermal contact between the platen portion and a substrate mounted thereon. The configuration of the support structure 106, and particularly the thermally-resistant sealing elements (e.g., seals 158, 160, and O-ring 171) that are implemented in the support structure 106, thus provide substantially leak-free gas transport between the base plate 104 and the platen portion 102 during high temperature operation.

A further advantage provided by the support structure 106 of the present disclosure is that it may accommodate thermal expansion and contraction of the platen portion 102 relative to the base plate 104, such as may occur during heating and cooling of the platen portion during and after operation. Particularly, the support structure may be capable of flexing radially inwardly and outwardly, with the platen portion mounting tabs 126a-f moving radially nearer to and farther from the base plate mounting tabs 124a-f, thereby allowing expansion and contraction of the platen portion 102 relative to the base plate 104 without imparting stresses to the platen portion that could otherwise cause damage. Such flexing may be facilitated by the geometry of the flexure 116 (e.g., the serpentine connecting segments 122a-l), as well as the material of the flexure 116.

Another advantage provided by the support structure 106 of the present disclosure is that it provides good thermal isolation between the platen portion 102 and the base plate 104. For example, the insulating gas feed fixtures 146a-f and the low emissivity surfaces and minimum view factors of the platen portion mounting tabs 126a-f and the flexure 116 may minimize the amount of heat that may be lost from the platen portion 102 via conduction and radiation. This may provide the platen portion 102 with better temperature uniformity, and may therefore reduce internal stress within the platen portion by mitigating cold spots that may otherwise form in the platen portion.

Yet another advantage provided by the support structure 106 of the present disclosure is that it provides a mechanical coupling between the platen portion 102 and the base plate 104 that is sufficiently stiff to prevent excessive relative motion of the platen portion and the base plate during movement (e.g., acceleration) of the platen 100 by a scanning mechanism. It will of course be appreciated that the particular stiffness of the coupling may vary based on variations in the geometry and material of the flexure 116.

Figure 6:
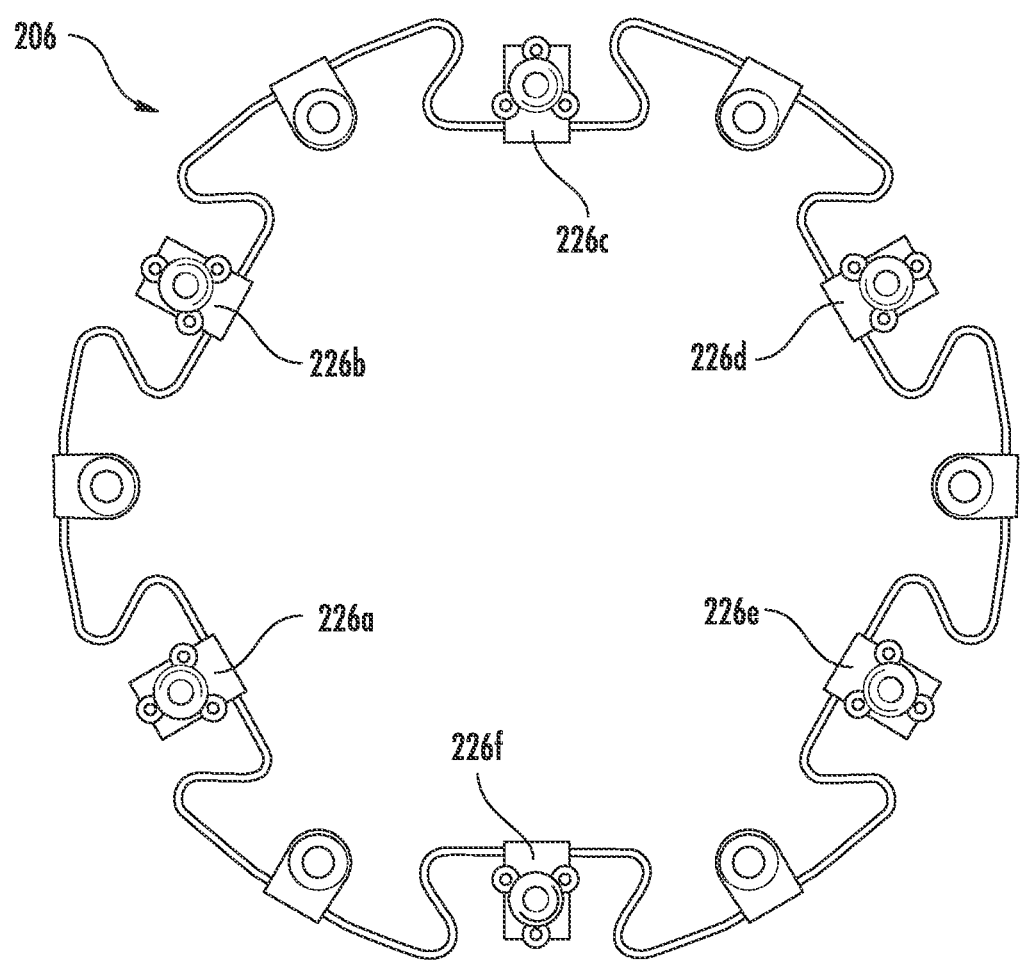
FIG. 6 is a top view illustrating another platen support structure in accordance with an embodiment of the present disclosure.

FIG. 6 illustrates a partial top view of an alternative platen support structure 206. The support structure 206 may be substantially similar to the support structure 106 described above, but it may be provided with platen portion mounting tabs 226a-f that are configured differently than the platen portion mounting tabs 126a-f. This difference is best illustrated in FIG. 7, which shows a cross section view of the platen portion mounting tab 226a and a respective gas feed fixture 246a that may couple the platen portion mounting tab 226a to a platen portion 202 of a platen.

The gas feed fixture 246a may include a gas feed tube 248 that may be formed of a material having a thermal expansion rate that is similar to that of the platen portion 202. One non-limiting example of such a material is a nickel-cobalt ferrous alloy (e.g., KOVAR). Alternatively, it is contemplated that the gas feed tube 248 may be formed of various ceramics which may facilitate better thermal isolation of the platen portion 202 relative to metals. The gas feed tube 248 may be seated axially within a cylindrical opening 250 in the top of the platen portion mounting tab 226a. The opening 250 may be open to a gas outlet slot 234 that extends through the platen portion mounting tab 226a and that is in fluid communication with the gas conduit 232 within the flexure 216 (shown in FIG. 6) of the support structure 206. The gas feed tube 248 may extend above the platen portion mounting tab 226a and may be provided with first and second annular flanges 252, 253 that extend radially-outwardly therefrom. The first annular flange 252 may be seated atop the platen portion mounting tab 226a and may be fastened thereto by mechanical fasteners 255 (e.g., threaded fasteners such as socket head cap screws). An annular seal 258, which may be formed of a thermally-resistant material (e.g., a stainless steel), may be disposed between the first annular flange 252 and the platen portion mounting tab 226a, such as in an annular recess 259 in the top of the platen portion mounting tab 226a, for providing a substantially fluid-tight connection between the platen portion mounting tab 226a and the gas feed tube 248. The hollow interior of the gas feed tube 248 may define a gas pass-through conduit 262 that extends from the opening 250 in the platen portion mounting tab 226a to an outlet port 268 in an upper end 270 of the gas feed tube 248.

Figure 7:
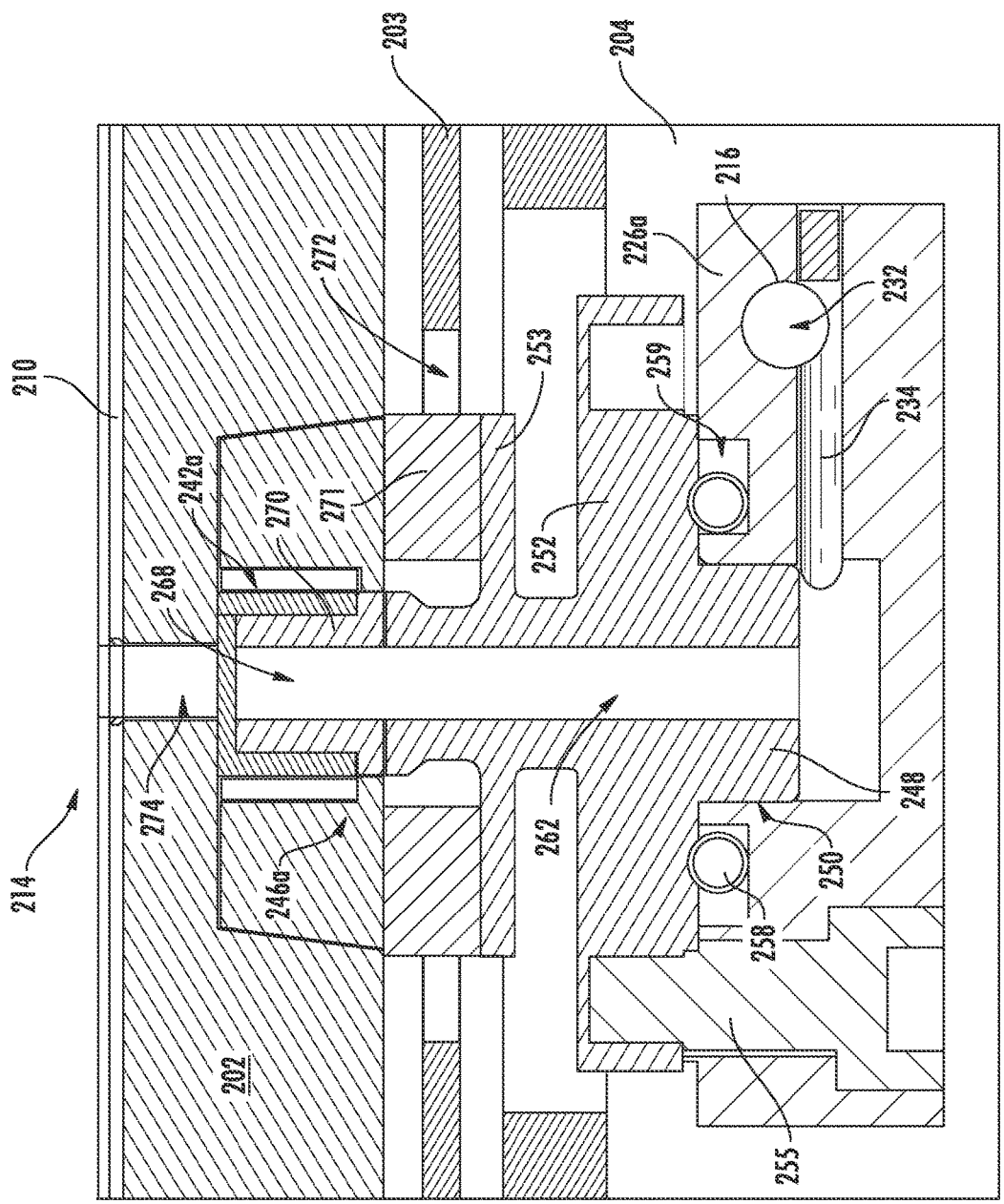
FIG. 7 is a partial cut-away view showing a gas feed fixture of the support structure shown in FIG. 6.

Still referring to FIG. 7, the gas feed tube 248 may extend above the top surface of the base plate 204 and through an aperture 272 in the radiation shield 203 of the platen. An O-ring 271, which may be formed of a thermally-resistant material (e.g., stainless steel), may be disposed atop the second annular flange 253 and may flatly engage the backside of the platen portion 202, thereby supporting the platen portion at a distance above the base plate 204 and providing a fluid-tight seal between the gas feed tube 248 and the platen portion 202. The upper end 270 of the gas feed tube 248 may extend into the mounting hole 242a in the platen portion 202. The gas pass-through conduit 262 in the gas feed tube 248 may thereby provide a fluid passageway that extends between the gas outlet slot 234 in the platen portion mounting tab 226a and a gas port 274 that extends from the mounting hole 242a in the backside of the platen portion 202 to an interface region 214 on a support surface 210 of the platen portion.

Figure 8:
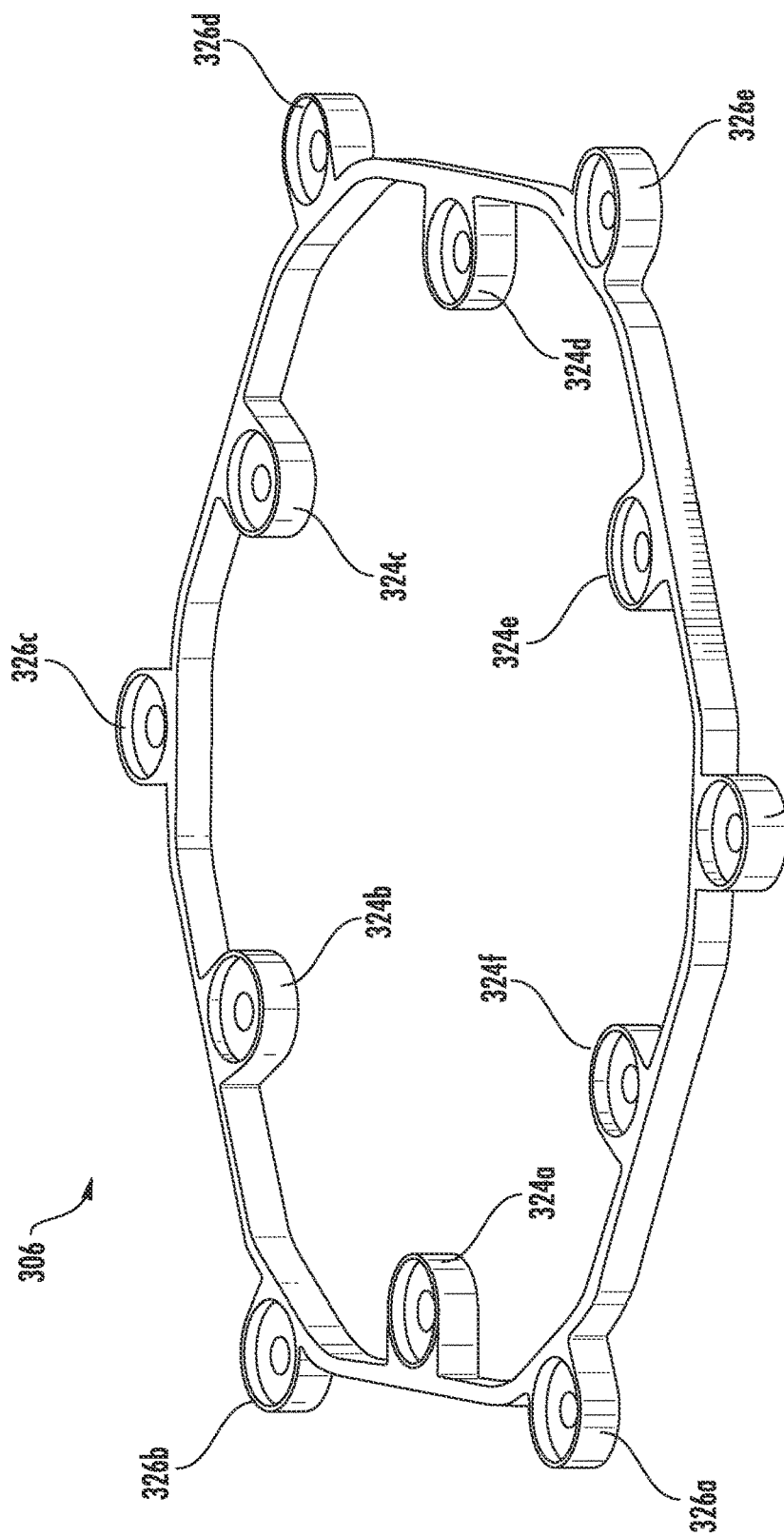
FIG. 8 is a top view illustrating another platen support structure in accordance with an embodiment of the present disclosure.

FIG. 8 illustrates a perspective top view of another alternative platen support structure 306. The support structure 306 may be similar to the support structure 106 described above, and may be provided with a plurality of base plate mounting tabs 324a-f and platen portion mounting tabs 326a-f connected to a flexure 316. The base plate mounting tabs 324a-f and platen portion mounting tabs 326a-f may be substantially identical to the base plate mounting tabs 124a-f and platen portion mounting tabs 126a-f of the support structure 106, and may be used to couple the support structure 306 to a platen portion and a base plate of a platen (not shown) in a substantially similar manner. However, the flexure 316 may differ from the flexure 116 of the support structure 106 in that it may be formed of rectangular tubing (instead of round tubing) and may have substantially straight sides, omitting the serpentine features of the flexure 116 described above. Nonetheless, the flexure 316 may exhibit substantially the same stiffness and flexibility as the flexure 116, and may therefore facilitate substantially the same degree of relative expansion, contraction, and movement between a platen portion and a base plate that may be coupled together by the flexure 316. Of course, it will be appreciated that the stiffness and flexibility of the flexure 316 may be varied by varying the configuration and/or material of the flexure 316.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The present disclosure is not to be limited in scope by the specific embodiments described herein. Indeed, various other embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A platen support structure comprising:
a tubular flexure defining an internal gas conduit within the tubular flexure;
a platen portion mounting tab connected to the tubular flexure and in fluid communication with the internal gas conduit, the platen portion mounting tab adapted for connection to a platen portion of a heated platen configured to support a substrate;
a gas feed fixture comprising a gas feed tube extending through a mounting hole in the platen portion mounting tab, wherein an interior of the gas feed tube is in fluid communication with the platen portion mounting tab and the internal gas conduit, the gas feed tube having a first flange that engages a first side of the platen portion mounting tab, wherein a locking nut engages an end of the gas feed tube that protrudes from a second side of the platen portion mounting tab; and
a base plate mounting tab connected to the tubular flexure and in fluid communication with the internal gas conduit, the base plate mounting tab being adapted for connection to a base plate of the heated platen.

2. The platen support structure of claim 1, wherein the tubular flexure comprises a plurality of radially-outermost segments and a plurality of radially-innermost segments, wherein the radially-outermost segments are connected to the radially-innermost segments by a plurality of serpentine connecting segments.

3. The platen support structure of claim 1, wherein the tubular flexure is formed of round tubing.

4. The platen support structure of claim 1, wherein the tubular flexure is formed of rectangular tubing.

5. The platen support structure of claim 1, wherein the base plate mounting tab is provided with a mounting hole formed therethrough, the mounting hole in fluid communication with the internal gas conduit.

6. The platen support structure of claim 1, wherein the base plate mounting tab, the internal gas conduit, and the platen portion mounting tab define a continuous passageway for conducting a gas.

7. The platen support structure of claim 1, wherein the gas feed tube is provided with a second flange having an O-ring seated thereon, wherein the O-ring is adapted to support the platen portion.

8. A heated platen comprising:
   a platen portion configured to support a substrate, the platen portion having a gas port for providing a gas to an interface region on a surface of the platen portion;
   a base plate;
   a tubular flexure disposed intermediate the platen portion and the base plate, the flexure defining an internal gas conduit within the tubular flexure;
   a platen portion mounting tab connected to the tubular flexure and in fluid communication with the internal gas conduit, the platen portion mounting tab coupled to the platen portion;
   a gas feed fixture comprising a gas feed tube extending through a mounting hole in the platen portion mounting tab, wherein an interior of the gas feed tube is in fluid communication with the platen portion mounting tab and the internal gas conduit, the gas feed tube having a first flange that engages a first side of the platen portion mounting tab, wherein a locking nut engages an end of the gas feed tube that protrudes from a second side of the platen portion mounting tab; and
   a base plate mounting tab connected to the tubular flexure and in fluid communication with the internal gas conduit, the base plate mounting tab coupled to the base plate.

9. The heated platen of claim 8, wherein the tubular flexure comprises a plurality radially-outermost segments and a plurality of radially-innermost segments, wherein the radially-outermost segments are connected to the radially-innermost segments by a plurality of serpentine connecting segments.

10. The heated platen of claim 8, wherein the tubular flexure is formed of round tubing.

11. The platen of claim 8, wherein the tubular flexure is formed of rectangular tubing.

12. The heated platen of claim 8, wherein the base plate mounting tab is provided with a mounting hole formed therethrough, wherein the mounting hole is in fluid communication with the internal gas conduit.

13. The platen of claim 8, wherein the gas feed tube is provided with a second annular flange having an O-ring seated thereon, wherein the O-ring engages a backside of the platen portion.

14. A platen comprising:
   a platen portion configured to support a substrate, the platen portion having a gas port for providing a gas to an interface region on a surface of the platen portion;
   a base plate;
   a tubular flexure disposed intermediate the platen portion and the base plate, the flexure defining an internal gas conduit within the tubular flexure;
   a platen portion mounting tab connected to the tubular flexure, the platen portion mounting tab having a mounting hole formed therethrough, wherein the mounting hole is in fluid communication with the internal gas conduit, the platen portion mounting tab coupled to the platen portion;
   a base plate mounting tab connected to the tubular flexure, the base plate mounting tab having a mounting hole formed therethrough, wherein the mounting hole is in fluid communication with the internal gas conduit, the base plate mounting tab coupled to the base plate; and
   a gas feed fixture comprising a gas feed tube extending through the mounting hole in the platen portion mounting tab and into the gas port, wherein an interior of the gas feed tube is in fluid communication with the platen portion mounting tab and the internal gas conduit, the gas feed tube having a first flange that engages a first side of the platen portion mounting tab, wherein a locking nut engages an end of the gas feed tube that protrudes from a second side of the platen portion mounting tab.

* * * * *